United States Patent
Kang et al.

(10) Patent No.: US 6,831,012 B2
(45) Date of Patent: Dec. 14, 2004

(54) METHOD FOR FORMING A SILICIDE FILM OF A SEMICONDUCTOR DEVICE

(75) Inventors: Dae-Keun Kang, Suwon-si (KR); Yong-Sun Ko, Suwon-si (KR); In-Seak Hwang, Suwon-si (KR); Byoung-Moon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 10/445,858

(22) Filed: May 28, 2003

(65) Prior Publication Data

US 2004/0029378 A1 Feb. 12, 2004

(30) Foreign Application Priority Data

Aug. 8, 2002 (KR) ........................................ 2002-46851

(51) Int. Cl.⁷ .............................................. H01L 21/44
(52) U.S. Cl. ....................... 438/682; 438/630; 438/648; 438/649; 438/655; 438/656; 438/683
(58) Field of Search ................................ 438/301, 595, 438/630, 648, 649, 651, 655, 656, 664, 682, 683, 942

(56) References Cited

U.S. PATENT DOCUMENTS

| 5,876,796 | A | * | 3/1999 | Regolini et al. | ........ 427/255.17 |
| 6,015,748 | A | * | 1/2000 | Kim et al. | .................. 438/592 |
| 6,100,145 | A | | 8/2000 | Kepler et al. | |
| 6,171,942 | B1 | * | 1/2001 | Lee et al. | .................... 438/596 |
| 6,326,669 | B1 | * | 12/2001 | Hwang et al. | .............. 257/384 |
| 6,743,669 | B1 | * | 6/2004 | Lin et al. | .................... 438/238 |

FOREIGN PATENT DOCUMENTS

| KR | 1019990076400 | 10/1999 |
| KR | 2001-0001766 | 1/2001 |

* cited by examiner

Primary Examiner—Richard Elms
Assistant Examiner—Beth E. Owens
(74) Attorney, Agent, or Firm—Volentine Francos & Whitt, PLLC

(57) ABSTRACT

After a silicidation blocking pattern is formed on a substrate including silicon, the silicidation blocking pattern is hardened by a thermal annealing process. The substrate is rinsed to remove a native oxide film formed on the substrate, and then a silicide film is formed on a portion of the substrate exposed by the silicidation blocking pattern. The silicide film can thus be formed in an exact portion of the substrate, and the substrate is not damaged during rinsing.

20 Claims, 9 Drawing Sheets

METHOD FOR FORMING A SILICIDE FILM OF A SEMICONDUCTOR DEVICE

BACKGROUND OF THE INVENTION

1. Field of the Invention

The present invention relates to a method for forming a silicide film of a semiconductor device, and more particularly to a method for forming a silicide film of a semiconductor device using a silicidation blocking layer.

2. Description of the Background Art

As information technology rapidly develops, highly integrated semiconductor devices having rapid data transfer rates are needed in order to quickly process large amounts of data. Thus, the patterns of the semiconductor devices have become extremely minute and also have multi-layered structures. Since the patterns have multi-layered structures, contacts should be formed to electrically connect the patterns that are spaced apart from each other by interlayer dielectric films. The sizes of contact windows for connecting the patterns are reduced according to the degree of integration of the semiconductor device. Hence, when polysilicon is used for forming contacts as in conventional methods for forming semiconductor devices, the semiconductor device may not operate at a high speed and power consumption of the semiconductor device may increase because contact resistance or sheet resistance increases.

To solve the above-mentioned problem, a method for forming a metal silicide film including a compound of metal and silicon on active regions such as source/drain regions of a semiconductor device is known. The process for forming the silicide film is known as a silicidation process. For example, a silicidation process is disclosed in U.S. Pat. No. 6,100,145 issued to Kepler et al.

In the silicidation process, a metal such as titanium (Ti), nickel (Ni) or cobalt (Co) is deposited and thermally treated so that titanium silicide, nickel silicide or cobalt silicide is formed accordingly as the metal reacts with silicon existing in an underlying layer. As for a semiconductor device manufactured with a design rule of approximately 0.25 μm, cobalt silicide is mainly used because cobalt silicide does not much depend on the critical dimension (CD) of the gate electrode of the semiconductor device.

A memory cell region and a logic region are formed together as one chip in view of the required high integration of semiconductor devices. When silicide films are formed in both the memory cell and the logic regions, the junction leakage current characteristic of the semiconductor device may be deteriorated due to the silicide film, being formed in the source/drain region of the memory cell region. As a result, the refresh characteristic of the semiconductor device may be deteriorated and power consumption of the semiconductor device may be increased because the data maintenance characteristic of the memory cell is deteriorated.

Accordingly, the silicidation process should be executed in the memory cell region and the logic region using different materials, or the silicidation process should be selectively performed in the memory cell and the logic regions. Particularly, the silicide film should be formed on the gate electrode and on the source/drain in the logic region, but the silicide film should be formed only on the gate electrode in the memory cell region, in order to improve the contact characteristic. For such purpose, a silicidation blocking layer (SBL) is formed so that the silicidation process is selectively performed at a desired region. When the SBL is present, the silicide film is not formed in the memory cell region, but the silicide film is selectively formed in the peripheral region of the DRAM and in the active portion of the logic region of the DRAM, so that the refresh characteristic is prevented from being deteriorated.

Before cobalt is deposited, the SBL can be formed using a middle temperature oxide (MTO) that does not react with cobalt. The SBL may include a silicon nitride (SiN) film formed through a low pressure chemical vapor deposition (LPCVD) process.

Korean Laid Open Patent Publication No. 1999-76400 discloses a method for forming the SBL of a transistor. However, the impurity ions implanted into the source/drain region may be thermally stressed because the SBL is formed at a high temperature of above approximately 650° C., after an ion implantation process for the source/drain region is completed. That is, after the ions are implanted into the source/drain region, the ions in the source/drain region are diffused and rearranged in accordance with the thermal stress caused by the formation of the SBL.

Also, when a dry etching process is executed to remove the SBL, the performance of the transistor may be deteriorated because the elements of the transistor can be damaged due to the plasma applied during the etching process. Thus, the SBL is typically formed through a chemical vapor deposition (CVD) process at a low temperature, and the SBL is patterned to form a SBL pattern using an etching solution having a high etching selectivity relative to underlying layers.

However, when a rinsing process is executed in order to remove an oxide film naturally formed on a substrate before cobalt is deposited, a failure such as a short may occur because the SBL formed by the CVD process is exceedingly etched such that the SBL does not block the silicidation during depositing of the cobalt. As a result, the productivity of the semiconductor manufacturing process may be reduced.

SUMMARY OF THE INVENTION

The present invention is therefore directed to a method for forming a silicide film of a semiconductor device which substantially overcomes one or more of the problems due to the limitations and disadvantages of the related art.

An object of the present invention is to therefore provide a method for forming a silicide film of a semiconductor device using a hardened silicidation blocking layer.

In order to achieve this and other objects of the present invention, there is provided a method for forming a silicide film of a semiconductor device, wherein after formation of a silicidation blocking pattern on a semiconductor substrate including silicon, the silicidation blocking pattern is hardened by a thermal treatment. A native oxide film formed on the substrate is removed by rinsing the substrate, because the native oxide film would prevent subsequent formation of a silicide film. The silicide film is formed in a region of the substrate exposed by the silicidation blocking pattern.

Also, to achieve the above and other objects of the present invention, there is provided a method for forming a silicide film of a semiconductor device, wherein after forming gate electrodes including polysilicon on a semiconductor substrate having silicon, source/drain regions are formed by implanting impurity ions into portions of the substrate adjacent to the gate electrodes, and spacers are formed on sidewalls of the gate electrodes, respectively. A silicidation blocking pattern is formed on the substrate including the gate electrodes and the source/drain regions to expose a portion of the substrate where a silicide film is to be formed. The silicidation blocking pattern is hardened and the ions in the source/drain regions are activated by rapidly and thermally treating the substrate under a nitrogen gas atmosphere. A native oxide film formed on the substrate is removed by rinsing the substrate, because the native oxide film would prevent subsequent formation of a silicide film. The silicide film is formed on the exposed portion of the substrate.

According to the present invention, the suicide film can be exactly formed on a certain portion of the substrate, and the substrate is not damaged during rinsing of the substrate due to the hardening of the silicidation blocking layer by thermal treatment.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
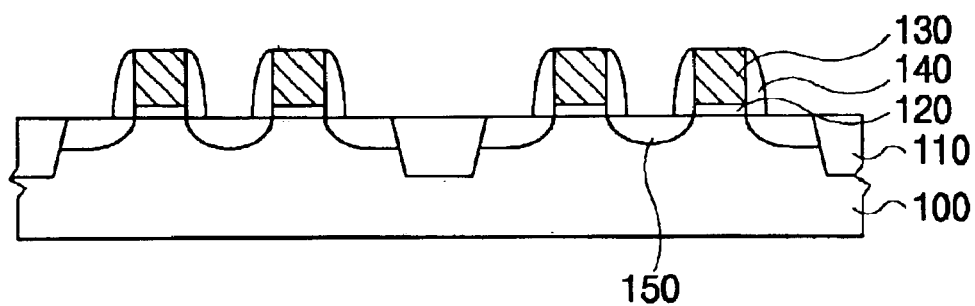
FIGS. 1A to 1G are cross-sectional views illustrating a method for manufacturing a semiconductor device according to a first embodiment of the present invention.

Hereinafter, the preferred embodiments of the present invention are described in detail with reference to the accompanying drawings. In the following drawings, like reference numerals identify similar or identical elements.

FIGS. 1A to 1G are cross-sectional views illustrating a method for manufacturing a semiconductor device according to a first embodiment of the present invention. Referring to FIG. 1A, a field oxide film 110 is formed on a silicon substrate 100 using a shallow trench isolation (STI) process for example, so that silicon substrate 100 is divided into an active region and a field region.

After a gate oxide film 120 is formed on the substrate 100, a polysilicon film is coated on the gate oxide film 120. The polysilicon film is highly doped with an N-type impurity, and a photoresist film is coated on the polysilicon film. The photoresist film is patterned to form a photoresist pattern by a photo process. The polysilicon film is etched to expose portions of the substrate 100 using the photoresist pattern as an etching mask. Then, the photoresist pattern is removed, and gate electrodes 130 are thus formed on the gate oxide 120, respectively.

Subsequently, source/drain regions 150 are formed at the exposed portions of the substrate 100 by an ion implantation (IIP) process. The source/drain regions 150 are disposed between the gate electrodes 130, respectively. After an insulation film including silicon oxide or silicon nitride is deposited on the gate electrodes 130 and on the substrate 100, the insulation film is anisotropically etched to form gate spacers 140 on sidewalls of the gate electrodes 130, respectively.

Figure 1B:
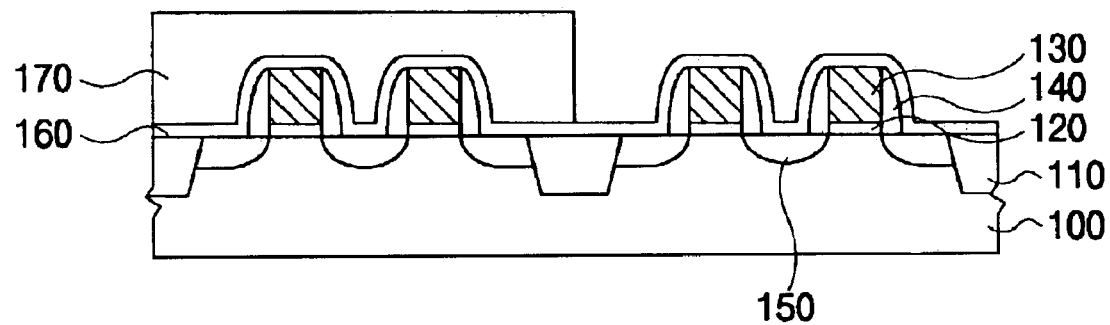

Referring to FIG. 1B, a buffer layer (not shown) is formed on the whole surface of the substrate 100 having the gate electrodes 130 formed thereon. The buffer layer including oxide is uniformly formed on the substrate 100. A silicidation blocking layer (SBL) 160 is formed on the buffer layer through a plasma enhanced chemical vapor deposition (PECVD) process at a temperature of below approximately 450° C. The silicidation blocking layer 160 includes silicon oxy-nitride (SiON). The buffer layer prevents damage of the substrate 100 and the field oxide film 110 during etching the SBL 160 in a subsequent process. After a photoresist film is coated on the SBL 160, the photoresist film is patterned to form a photoresist pattern 170 through a photo process. The photoresist pattern 170 is opened at a portion of the SBL 160 where a silicide film is to be formed.

Figure 1C:
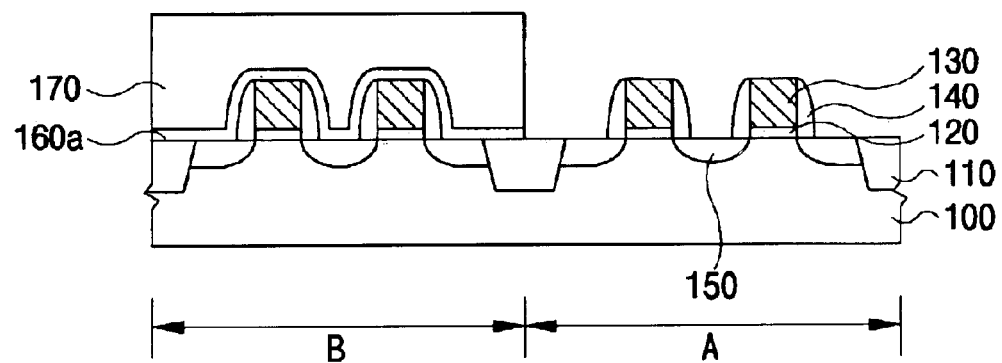

Referring to FIG. 1C, the portion of the exposed SBL 160 where the silicide film is to be formed is etched using the photoresist pattern 170 as an etching mask, so that a SBL pattern 160a is formed. The SBL pattern 160a defines a silicidation activation region A and a silicidation inactivation region B. The SBL 160 is etched using a mixture of approximately 0.4 to 5% by volume of a hydrogen fluoride solution, approximately 45% to 85% by volume of a hydrogen peroxide solution, and deionized water. In this case, a concentration of the hydrogen fluoride solution is approximately 20 to 30M(mol./l), and a concentration of the hydrogen peroxide solution is approximately 8 to 10M.

Figure 1D:
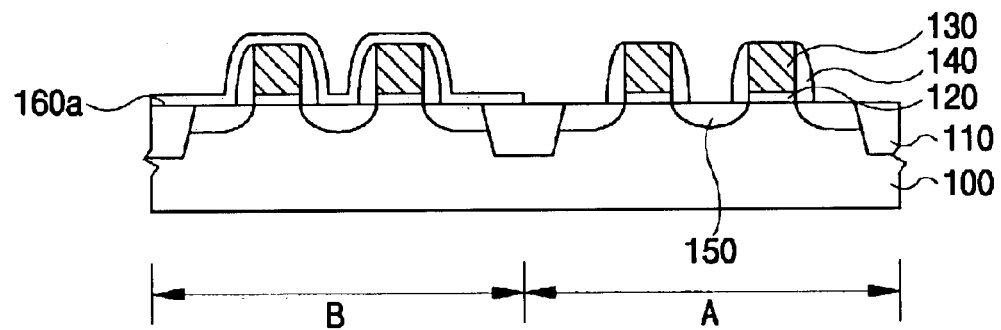

Referring to FIG. 1D, the photoresist pattern 170 is removed through an ashing process and a stripping process. The substrate 100 including the SBL pattern 160a formed thereon is treated through a rapid thermal annealing (RTA) process. Thus, the SBL pattern 160a is hardened and the ions implanted in the source/drain regions 150 are activated. Here, the substrate 100 is treated at a temperature of approximately 800 to 1,200° C. under an inert gas atmosphere such as nitrogen for example. During the RTA process, the temperature is rapidly increased and maintained between approximately 800 to 1,200° C. for about 5 to 40 seconds so that the SBL pattern 160a is hardened. Though the SBL pattern 160a comes to be hardened immediately by the thermal treatment, the thermal treatment is maintained for more than approximately 5 seconds to harden the SBL pattern 160a until the SBL pattern 160a has a certain degree of hardness. However, the RTA process does not proceed any longer than 40 seconds in consideration of the productivity of the process, because the hardness of the SBL pattern 160a becomes saturated when the RTA process is executed more than approximately 40 seconds.

The impurity ions in the source/drain regions 150 are thus thermally treated during hardening of the SBL pattern 160a without an additional thermal treatment. Hence, rearrangements of the impurity ions caused by repeated thermal treatments can be prevented because the impurity ions in the source/drain regions 150 are thermally treated when the SBL pattern 160a is thermally treated, after the impurity ions are implanted into the source/drain regions 150. In addition, deterioration of the gate electrodes 130 and the source/drain regions 150 can be prevented because the substrate 100 is rapidly treated through the RTA process.

Before the silicide film is formed in the silicidation activation region A exposed through the formation of the SBL pattern 160a, the activation region A is rinsed in order to remove a native oxide film. In this case, a rinsing solution can be a hydrogen fluoride solution or a supersaturated ammonia solution, and also can be a mixture of a hydrogen fluoride solution and a supersaturated ammonia solution.

Figure 2A:
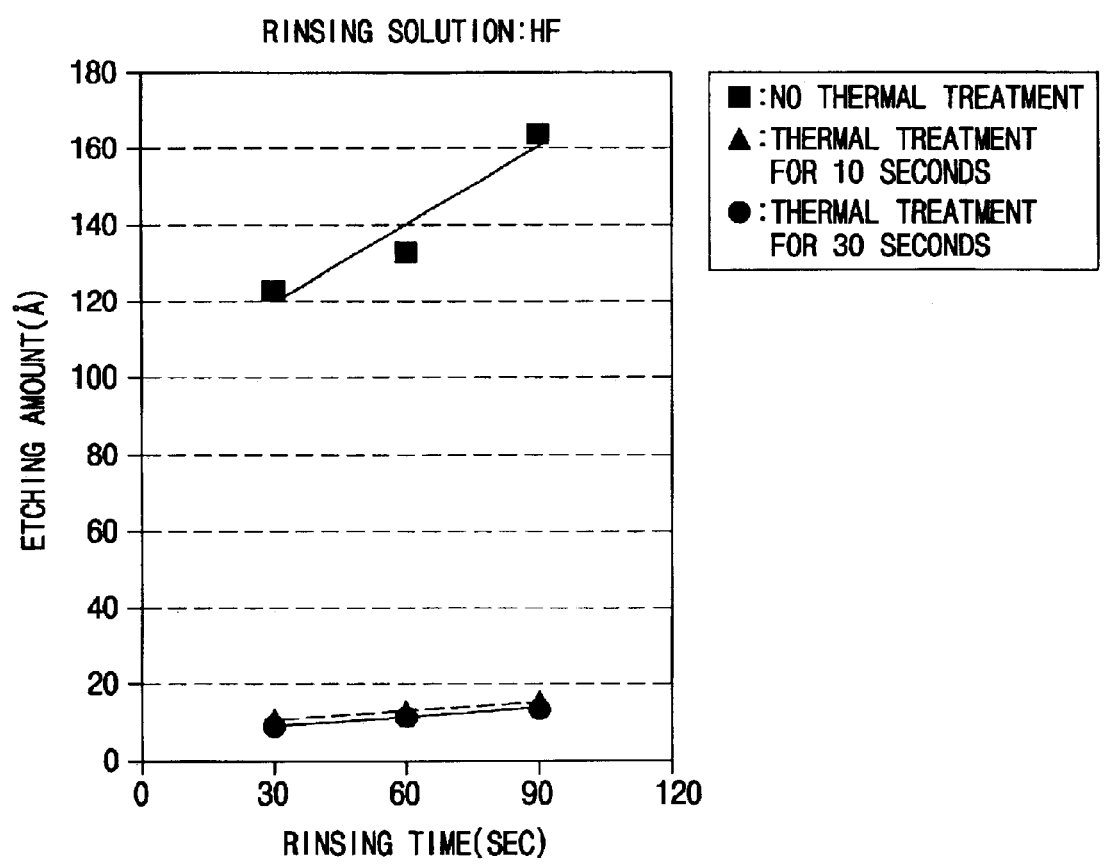
FIGS. 2A and 2B are graphs showing etching amounts relative to a rinsing solution in accordance with a time for hardening an SBL pattern of the present invention.
Figure 2B:
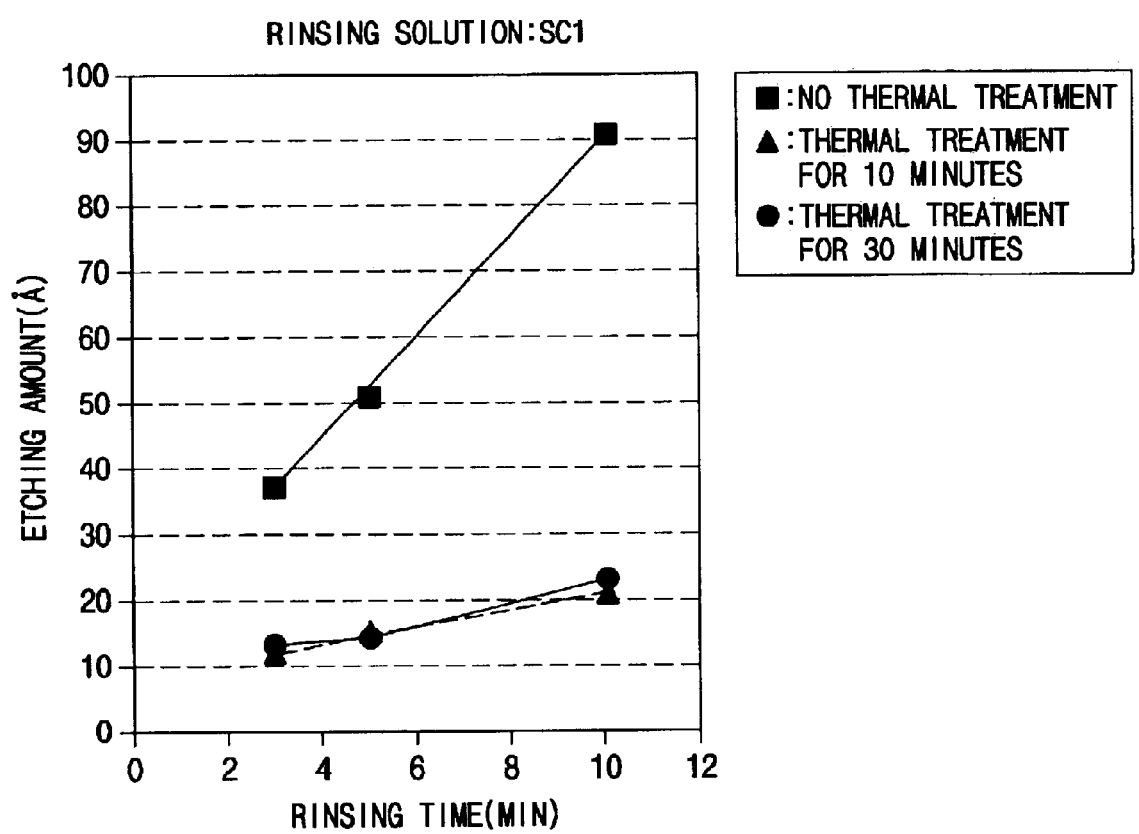

FIGS. 2A and 2B are graphs showing etching amounts relative to the rinsing solution in accordance with the hardening time of the SBL pattern of the present invention. Referring to FIG. 2A, a first SBL pattern was thermally treated at a temperature of approximately 1,000° C. for about 10 seconds, and a second SBL pattern was also thermally treated at a temperature of approximately 1,000° C. for about 30 seconds. Additionally, a third SBL pattern was not thermally treated. The first to the third SBL patterns were rinsed using a hydrogen fluoride solution for about 30 seconds, about 60 seconds, and about 90 seconds, respectively. The etching amounts of the first and the second SBL patterns were not greatly varied, but the etching amount of the third SBL pattern was more than three times that of the the first SBL pattern and more than twelve times that of the second SBL pattern.

Referring to FIG. 2B, a fourth SBL pattern was thermally treated at a temperature of approximately 1,000° C. for about 10 seconds, and a fifth SBL pattern was also thermally treated at a temperature of approximately 1,000° C. for about 30 seconds. Additionally, a sixth SBL pattern was not thermally treated. The fourth to the sixth SBL patterns were rinsed using the mixture of a hydrogen fluoride solution and a supersaturated ammonia solution for about 3 minutes, about 5 minutes, and about 10 minutes, respectively. The etching amounts of the fourth and the fifth SBL patterns were not greatly varied, but the etching amount of the sixth SBL pattern was more than three times that of the fourth and the fifth SBL patterns.

The etching amount of a hardened silicon oxy-nitride film (that is, the SBL pattern) varied little even though the rinsing time was increased. Thus, the hardened silicon oxy-nitride film cannot be easily damaged, because the etching amount of the silicon oxy-nitride film is small.

Figure 1E:
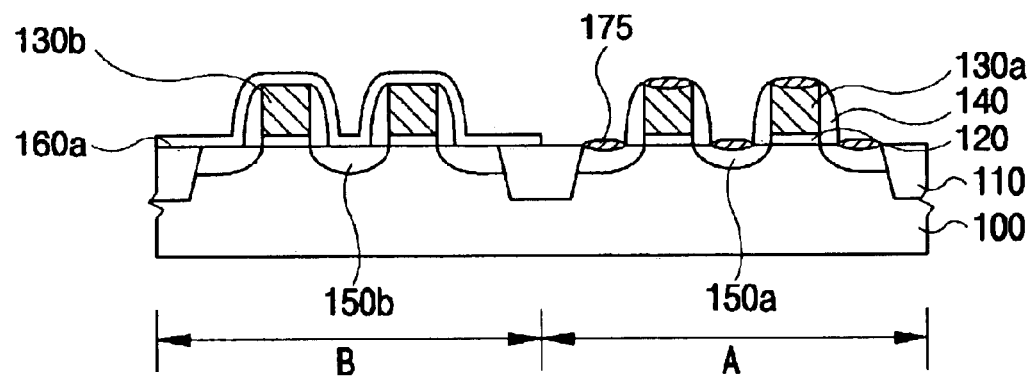

Referring to FIG. 1E, a metal film is formed on the whole surface of the rinsed substrate 100 including the activation region A exposed by the SBL pattern 160a and the inactivation region B. The metal film may be cobalt (Co), titanium (Ti), tungsten (W), or nickel (Ni).

When silicon exists beneath the metal film, the metal reacts with the silicon during thermal treatment so that metal silicide is formed. On the other hand, the metal film remains on the spacer 140, on the field oxide film 110, and on the inactivation region B where the SBL pattern 160a is formed without the formation of the metal silicide, because silicon does not exist in the inactivation region B, in the spacer 140 and in the field oxide film 110.

Accordingly, as a metal silicide film 175 is formed by the reaction between metal and silicon, the silicide film 175 is formed on the exposed gate electrodes 130 and on the exposed source/drain regions 150 in the silicidation activation region A. The silicide film 175 is not formed on the gate electrodes 130 and on the source/drain regions 150 in the silicidation inactivation region B where the SBL pattern 160a is formed. As a result, the gate electrodes 130 are divided into first gate electrodes 130a in the activation region A and second gate electrodes 130b in the inactivation region B. Also, the source/drain regions 150 are divided into first source/drain regions 150a in the activation region A and second source/drain regions 150b in the inactivation region B. Then, undesired metal remaining on the substrate 100 is removed.

Figure 1F:
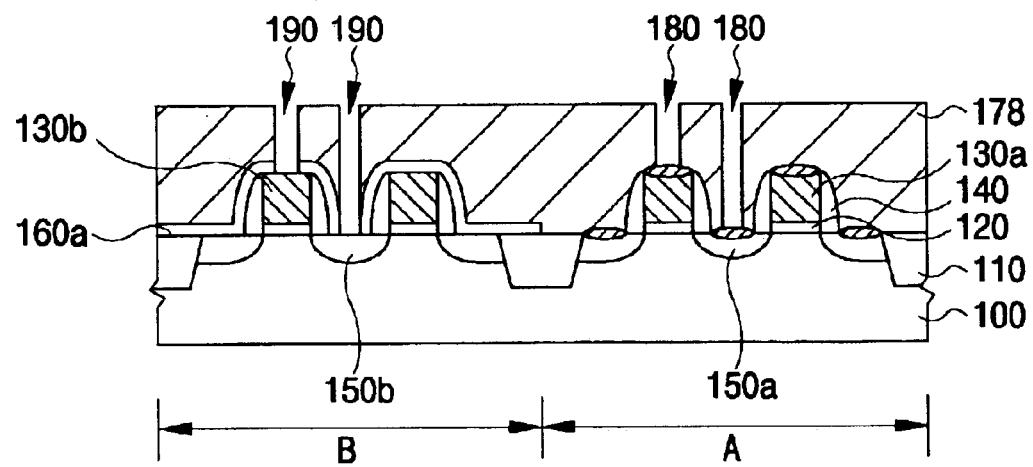

Referring to FIG. 1F, an insulation film 178 is formed on the activation and the inactivation regions A and B. The insulation film 178 is selectively and partially etched to expose portions of the first and the second gate electrodes 130a and 130b, and to expose portions of the first and the second source/drain regions 150a and 150b. Thus, first contact holes 180 are formed in the activation region A, and second contact holes 190 are formed in the inactivation region B.

Figure 1G:
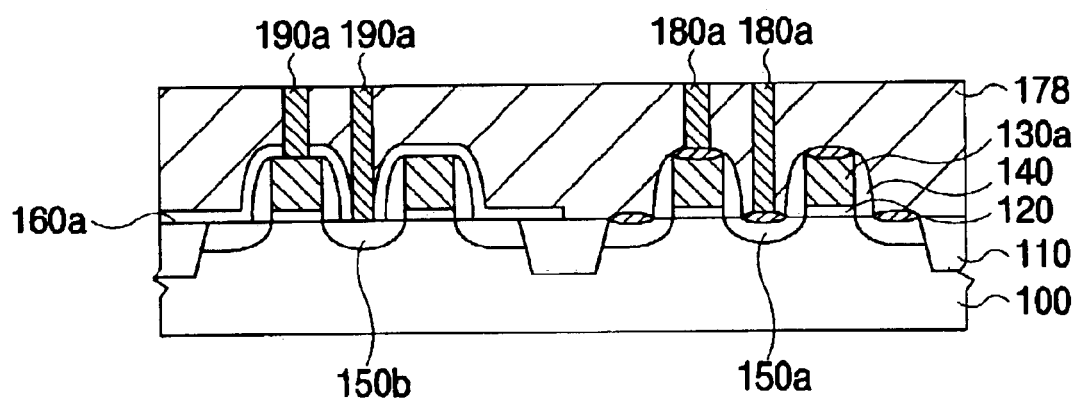

Referring to FIG. 1G, a metal film is formed on the insulation film 178 so that the first and second contact holes 180 and 190 are filled with metal. The metal film is polished through a chemical-mechanical polishing (CMP) process until an upper face of the insulation film 178 is exposed. As a result, first contact plugs 180a filling the first contact holes 180 are formed, and also second contact plugs 190a filling the second contact holes 190 are formed, respectively.

FIGS. 3A to 3F are cross-sectional views illustrating a method for manufacturing a semiconductor device according to a second embodiment of the present invention. In this embodiment, description of processes identical or similar to those of the first embodiment are omitted.

Figure 3A:
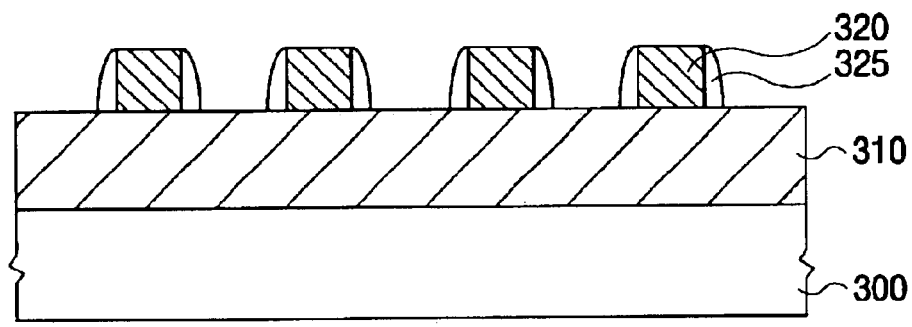
FIGS. 3A to 3F are cross-sectional views illustrating a method for manufacturing a semiconductor device according to a second embodiment of the present invention.

Referring to FIG. 3A, a first insulation film 310 is formed on a semiconductor substrate 300. In this case, the semiconductor substrate 300 may have conductive patterns formed thereon. After a polysilicon film is deposited on the first insulation film 310, the polysilicon film is made conductive by ion doping with impurities at a high concentration. The polysilicon film is patterned through a photolithography process so that bit line patterns 320 are formed on the substrate 300. If the bit line patterns 320 interfere with the conductive patterns positioned adjacent to the bit line patterns 320, bit line spacers 325 including oxide may be additionally formed on sidewalls of the bit line patterns 320.

Figure 3B:
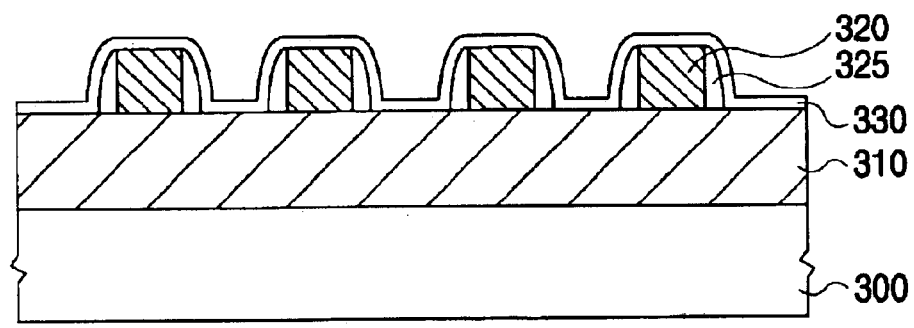

Referring to FIG. 3B, a silicon oxy-nitride film is uniformly formed on the whole surface of the first insulation film 310 where the bit line patterns 320 are formed so that a SBL 330 is formed on the first insulation film 310. The SBL 330 is formed through a PECVD process at a temperature of approximately 450° C. or below.

Figure 3C:
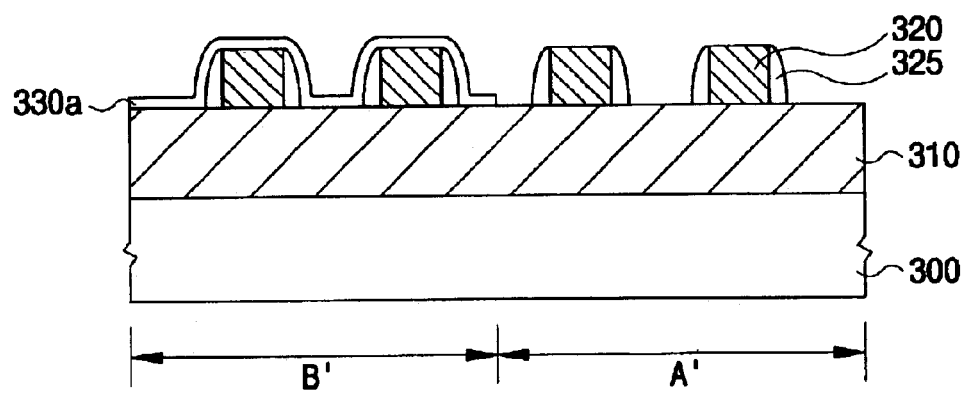

Referring to FIG. 3C, to enhance data transfer rates of the semiconductor device in each region of the semiconductor device, the SBL 330 is patterned through the photolithography process to expose portions of the substrate 300 where a silicide film is to be formed, thereby forming an SBL pattern 330a. Hence, the substrate 300 is divided into an activation region A' where the silicide film is to be formed, and an inactivation region B' on which the silicide film is not to be formed. The activation region A' is exposed in accordance with the formation of the SBL pattern 330a. Here, the SBL 330 is etched using a mixture of approximately 0.4 to 5% by volume of a hydrogen fluoride solution, approximately 45 to 85% by volume of a hydrogen peroxide solution, and deionized water. A concentration of the hydrogen fluoride solution is approximately 20 to 30M, and the hydrogen peroxide solution has a concentration of approximately 8 to 10M. Also, the deionized water is primarily or secondarily distilled water.

The substrate 300 having the SBL pattern 330a formed thereon is thermally treated through an RTA process so that the SBL pattern 330a is hardened. The substrate 300 is thermally treated at a temperature of approximately 800 to 1,200° C. under an inert gas atmosphere such as nitrogen for example. In this case, the substrate 300 is rapidly heated to a temperature of approximately 800 to 1,200° C., and then is maintained at a temperature of approximately 800 to 1,200° C. for about 5 to 40 seconds. Considering the productivity of the manufacturing process, the SBL pattern 330a should not be hardened more than about 40 seconds. The result of hardening of the SBL pattern 330a is identical to that of the first embodiment as shown in FIGS. 2A and 2B, so that further description is thus omitted.

The substrate 300 is rinsed so as to remove a native oxide film formed on the portion of the substrate 300 exposed by the SBL pattern 330a. The substrate 300 is rinsed using a hydrogen fluoride solution or a supersaturated ammonia solution. Also, the rinsing solution can be a mixture of a hydrogen fluoride solution and a supersaturated ammonia solution.

Figure 3D:
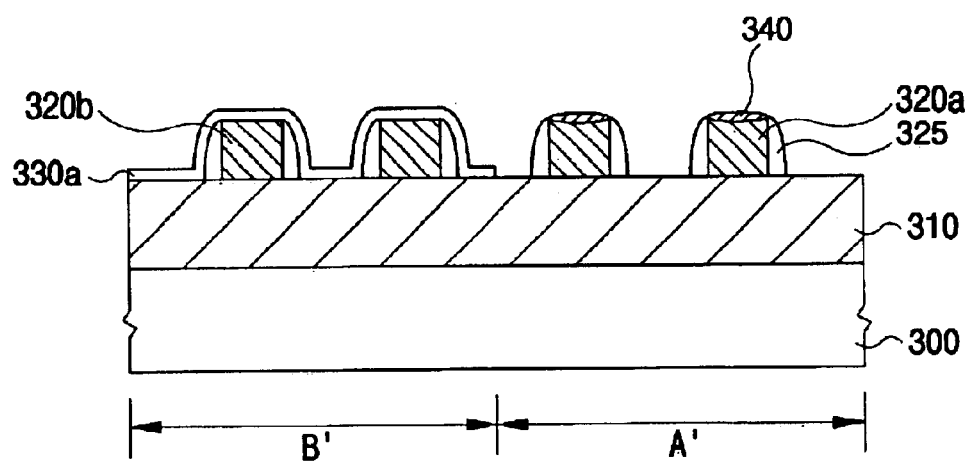

Referring to FIG. 3D, a metal film is formed on the whole surface of the substrate 300 including the activation region A' exposed by the hardened SBL pattern 330a, and the inactivation region B' where the hardened SBL pattern 330a is formed. The metal film can include cobalt, titanium, tungsten or nickel. A metal silicide film 340 is formed by a reaction between the metal and silicon during thermal treatment, so that the bit line patterns 320 are divided into a first bit line patterns 320a and a second bit line patterns 320b. The first bit line patterns 320a are formed of polysilicon film and the metal suicide film 340, and the second bit line patterns 320b are formed of the polysilicon film only.

When silicon exists under the metal film, the metal reacts with silicon to form the metal silicide. Otherwise, the metal film remains without reaction when formed on the spacers 325, the first insulation film 310 and on the hardened SBL pattern 330a, because silicon does not exist in the spacers 325, the first insulation film 310 and the hardened SBL pattern 330a. Then, undesired metal remaining on the substrate 300 is removed.

Figure 3E:
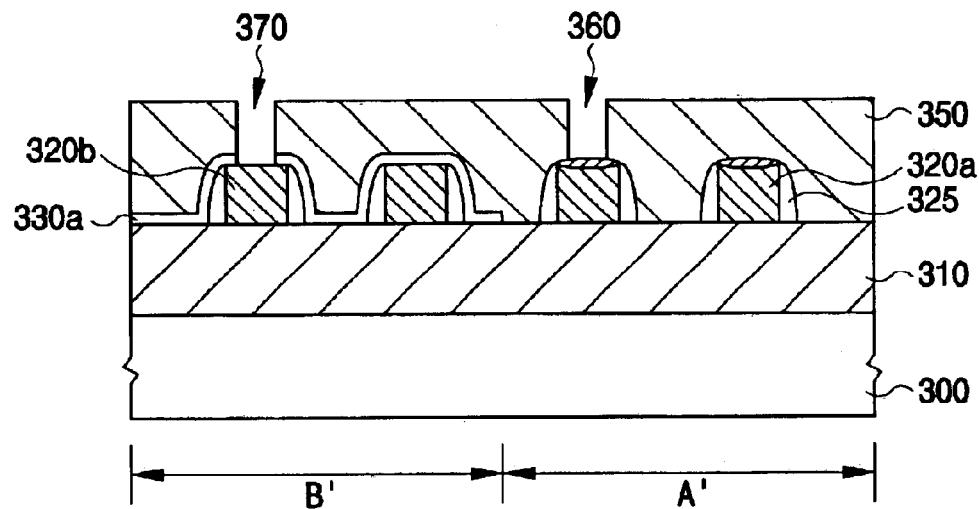

Referring to FIG. 3E, a second insulation film 350 is formed on the first insulation film 310, on the first bit line patterns where the metal silicide film 340 is formed, and on hardened SBL pattern 330a. Portions of the second insulation film 350 are selectively etched to expose the metal silicide film 340 of the first bit line patterns 320a and to expose an upper face of the second bit line patterns 302b. As a result, a first contact hole 360 is formed to expose the first bit line patterns 320a, and also a second contact hole 370 is formed to expose the second bit line patterns 320b.

Figure 3F:
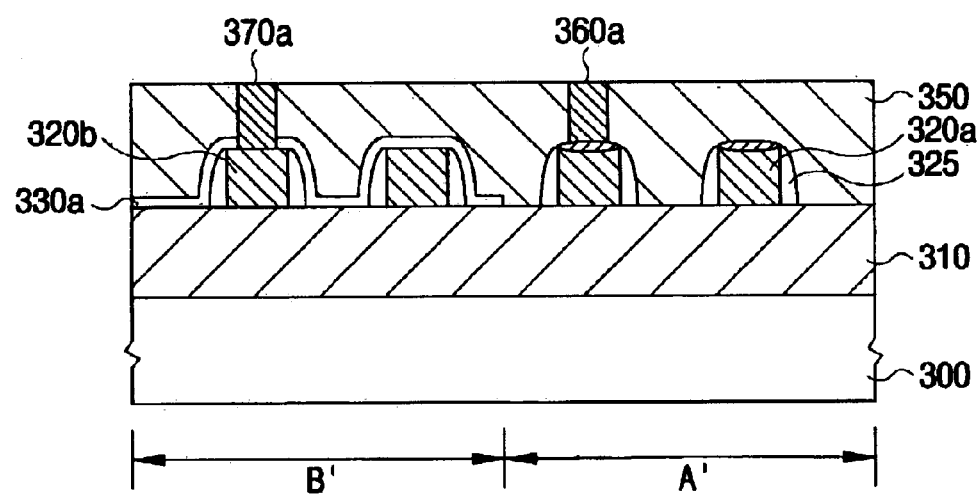

Referring to FIG. 3F, a metal film is coated on the second insulation film 350 to fill the first and the second contact holes 360 and 370. The metal film is polished through the CMP process until an upper face of the second insulation film 350 is exposed. Thus, a first contact plug 360a filling the first contact hole 360 and a second contact plug 370a filling the second contact hole 370 are formed.

As described above, according to the present invention, a silicidation blocking layer is formed on a substrate, and the silicidation blocking layer is hardened through an RTA process at a temperature of approximately 800 to 1,200° C. for about 5 to 40 seconds. Then, a silicide film is formed on the substrate after an oxide film is removed. Thus, the silicide film can be formed in an exact portion of the substrate as desired, and the substrate cannot be damaged during rinsing of the substrate after formation of the hardened silicidation blocking layer. As a result, data transfer rates of a semiconductor device can be selectively controlled due to the formation of the silicide film.

Having described the preferred embodiments for manufacturing a transistor and bit lines, it is noted that modifications and variations can be made by persons skilled in the art in light of the above teachings. Such modifications and variations are not to be regarded as a departure from the spirit and scope of the invention, and all such modifications as would be obvious to one skilled in the art are intended to be included within the scope of the following claims.

What is claimed is:

1. A method for forming a silicide film of a semiconductor device, comprising:

forming a silicidation blocking pattern on a semiconductor substrate including silicon;

hardening the silicidation blocking pattern by a thermal treatment;

rinsing the substrate to remove a native oxide film formed on the semiconductor substrate that would inhibit subsequent formation of a silicide; and forming a silicide film in a region of the semiconductor substrate exposed by the silicidation blocking pattern.

2. The method for forming a silicide film of a semiconductor device of claim 1, wherein the semiconductor substrate is rinsed using a hydrogen fluoride solution, a supersaturated ammonia solution, or a mixture of a hydrogen fluoride solution and a supersaturated ammonia solution.

3. The method for forming a silicide film of a semiconductor device of claim 1, further comprising:

forming a gate oxide film on the semiconductor substrate;

forming a gate electrode on the gate oxide film, wherein the gate electrode includes polysilicon; and forming a source/drain region on the semiconductor substrate by implanting impurity ions into a portion of the semiconductor substrate adjacent to a sidewall of the gate electrode, said forming a gate oxide film, said forming a gate electrode and said forming a source/drain region occurring prior to said forming a silicidation blocking pattern, and the polysilicon subsequently reacting with a metal during said forming a silicide film to form a metal silicide.

4. The method for forming a silicide film of a semiconductor device of claim 3, further comprising forming a gate spacer on the sidewall of the gate electrode after said forming a source/drain region, the gate spacer preventing subsequent formation of the silicide film.

5. The method for forming a silicide pattern of a semiconductor device of claim 1, wherein the silicidation blocking pattern comprises a silicon oxy-nitride pattern.

6. The method for forming a silicide film of a semiconductor device of claim 5, wherein said forming a silicidation blocking pattern comprises:

uniformly forming a silicon oxy-nitride film on the semiconductor substrate;

forming an insulation film on the silicon oxy-nitride film;

forming an insulation pattern that exposes a portion of the silicon oxy-nitride film under which the silicide film is to be formed; and forming the silicon oxy-nitride pattern by etching the exposed portion of the silicon oxy-nitride film.

7. The method for forming a silicide film of a semiconductor device of claim 6, wherein the silicon oxy-nitride film is formed by a chemical vapor deposition process at a temperature of no more than approximately 450° C.

8. The method for forming a silicide film of a semiconductor device of claim 6, wherein said forming the silicon oxy-nitride pattern comprises etching the silicon oxy-nitride film using a mixture of approximately 0.4 to 5% by volume of a hydrogen fluoride solution, approximately 45 to 85% by volume of a hydrogen peroxide solution, and deionized water, wherein a concentration of the hydrogen fluoride solution is approximately 20 to 30M and a concentration of the hydrogen peroxide solution is approximately 8 to 10M.

9. The method for forming a silicide film of a semiconductor device of claim 1, wherein said hardening the silicidation blocking pattern comprises a rapid thermal annealing process under an inert gas atmosphere.

10. The method for forming a silicide film of a semiconductor device of claim 1, wherein the silicidation blocking pattern is hardened at a temperature of approximately 800 to 1,200° C. for about 5 to 40 seconds.

11. The method for forming a silicide film of a semiconductor device of claim 1, wherein said forming a silicide film comprises:

forming a metal film on the semiconductor device;

forming a metal silicide by reacting silicon in the semiconductor device with a metal in the metal film; and removing an un-reacted metal remaining on the semiconductor device.

12. The method for forming a silicide film of a semiconductor device of claim 11, wherein the metal film comprises cobalt, titanium, tungsten or nickel.

13. The method for forming a suicide film of a semiconductor device of claim 1, wherein the silicidation blocking pattern is formed on polysilicon bit line patterns located on the semiconductor substrate.

14. A method for forming a silicide film of a semiconductor device, comprising:

forming gate electrodes including polysilicon on a semiconductor substrate having silicon;

forming source/drain regions by implanting impurity ions into portions of the semiconductor substrate adjacent to the gate electrodes;

forming spacers on sidewalls of the gate electrodes;

forming a silicidation blocking pattern on the semiconductor substrate including the gate electrodes and the source/drain regions, that exposes a portion of the semiconductor substrate;

hardening the silicidation blocking pattern and activating the impurity ions in the source/drain regions by rapidly and thermally treating the semiconductor substrate under a nitrogen gas atmosphere;

rinsing the semiconductor substrate to remove a native oxide film formed on the semiconductor substrate that would inhibit subsequent formation of a silicide; and forming a silicide film on the exposed portion of the semiconductor substrate.

15. The method for forming a silicide film of a semiconductor device of claim 14, wherein said forming a silicidation blocking pattern comprises:

uniformly forming a silicon oxy-nitride film on the semiconductor substrate including the gate electrodes, the source/drain regions and the spacers, by a chemical vapor deposition process at a temperature of below approximately 450° C.;

forming an insulation film on the silicon oxy-nitride film;

forming an insulation pattern that exposes a portion of the silicon oxy-nitride film under which the silicide film is to be formed; and etching the exposed portion of the silicon oxy-nitride film to form the silicidation blocking pattern.

16. The method for forming a silicide film of a semiconductor device of claim 15, wherein said etching comprises using a mixture of approximately 0.4 to 5% by volume of a hydrogen fluoride solution, approximately 45 to 85% by volume of a hydrogen peroxide solution, and deionized water, wherein a concentration of the hydrogen fluoride solution is approximately 20 to 30M and a concentration of the hydrogen peroxide solution is approximately 8 to 10M.

17. The method for forming a silicide film of a semiconductor device of claim 14, wherein the silicidation blocking pattern is hardened at a temperature of approximately 800 to 1,200° C. for about 5 to 40 seconds.

18. The method for forming a silicide film of a semiconductor device of claim 14, wherein said rinsing the semiconductor substrate uses a hydrogen fluoride solution, a supersaturated ammonia solution or a mixture of a hydrogen fluoride solution and a supersaturated ammonia solution.

19. The method for forming a silicide film of a semiconductor device of claim 14, wherein said forming a silicide film comprises:

forming a metal film on the semiconductor substrate including the gate electrodes, the source/drain regions, the spacers and the silicidation blocking pattern;

forming a metal suicide by reacting silicon in the semiconductor substrate with a metal in the metal film; and removing an un-reacted metal remaining on the semiconductor substrate.

20. The method for forming a silicide film of a semiconductor device of claim 19, wherein the metal film comprises cobalt, titanium, tungsten or nickel.

* * * * *